(12) United States Patent  
Asaad et al.

(10) Patent No.: US 8,640,070 B2  
(45) Date of Patent: Jan. 28, 2014

(54) METHOD AND INFRASTRUCTURE FOR CYCLE-REPRODUCIBLE SIMULATION ON LARGE SCALE DIGITAL CIRCUITS ON A COORDINATED SET OF FIELD-PROGRAMMABLE GATE ARRAYS (FPGAS)

(75) Inventors: Sameh W Asaad, Briarcliff Manor, NY (US); Ralph E Bellofatto, Ridgefield, CT (US); Bernard Brezzo, Somers, NY (US); Charles L Haymes, Fair Lawn, NJ (US); Mohit Kapur, Sleepy Hollow, NY (US); Benjamin D Parker, Peekskill, NY (US); Thomas Roewer, Danbury, CT (US); Jose A Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 507 days.

(21) Appl. No.: 12/941,834

(22) Filed: Nov. 8, 2010

(65) Prior Publication Data

US 2012/0117413 A1 May 10, 2012

(51) Int. Cl.
*G06F 17/50* (2006.01)

(52) U.S. Cl.
USPC .......................... 716/116; 716/106; 716/117

(58) Field of Classification Search
USPC ........................................ 716/106, 116, 117
See application file for complete search history.

(56) References Cited

U.S. PATENT DOCUMENTS

| | | | |
|---|---|---|---|
| 5,550,839 A | 8/1996 | Buch | |
| 6,421,251 B1 | 7/2002 | Lin | |
| 6,484,280 B1 | 11/2002 | Moberly | |
| 7,323,771 B2 | 1/2008 | Fujita | |
| 7,424,416 B1 | 9/2008 | Cavanagh | |

(Continued)

FOREIGN PATENT DOCUMENTS

WO  WO2006012335  5/2006

OTHER PUBLICATIONS

Dietmar Tutsch, et al., "CINSim-A Component based Interconnection network simulator for Modeling Dynamic Reconfiguration", Proceedings 12th Intern't Conference ASMTA 2005.

*Primary Examiner* — Thuan Do
*Assistant Examiner* — Mohammed Alam
(74) *Attorney, Agent, or Firm* — Anne V. Dougherty; Otterstedt, Ellenbogen & Kammer, LLP

(57) ABSTRACT

A plurality of target field programmable gate arrays are interconnected in accordance with a connection topology and map portions of a target system. A control module is coupled to the plurality of target field programmable gate arrays. A balanced clock distribution network is configured to distribute a reference clock signal, and a balanced reset distribution network is coupled to the control module and configured to distribute a reset signal to the plurality of target field programmable gate arrays. The control module and the balanced reset distribution network are cooperatively configured to initiate and control a simulation of the target system with the plurality of target field programmable gate arrays. A plurality of local clock control state machines reside in the target field programmable gate arrays. The local clock control state machines are coupled to the balanced clock distribution network and obtain the reference clock signal therefrom. The plurality of local clock control state machines are configured to generate a set of synchronized free-running and stoppable clocks to maintain cycle-accurate and cycle-reproducible execution of the simulation of the target system. A method is also provided.

20 Claims, 8 Drawing Sheets

(56) References Cited

U.S. PATENT DOCUMENTS

| | | |
|---|---|---|
| 2004/0078179 A1 | 4/2004 | Fuji |
| 2005/0131670 A1* | 6/2005 | Wang et al. ............... 703/23 |
| 2005/0289485 A1 | 12/2005 | Willis |
| 2006/0117274 A1* | 6/2006 | Tseng et al. ............... 716/1 |
| 2007/0164785 A1 | 7/2007 | He |
| 2012/0117413 A1* | 5/2012 | Asaad et al. ............... 713/501 |

* cited by examiner ional description.
METHOD AND INFRASTRUCTURE FOR CYCLE-REPRODUCIBLE SIMULATION ON LARGE SCALE DIGITAL CIRCUITS ON A COORDINATED SET OF FIELD-PROGRAMMABLE GATE ARRAYS (FPGAS)

STATEMENT REGARDING FEDERALLY SPONSORED RESEARCH OR DEVELOPMENT

This invention was made with Government support under Contract No. B554331 awarded by the Department of Energy. The Government has certain rights in this invention.

FIELD OF THE INVENTION

The present invention relates to the electrical, electronic and computer arts, and, more particularly, to circuit simulation and the like.

BACKGROUND OF THE INVENTION

Electronic circuits can be simulated using mathematical techniques. Because of the complexity and high tooling costs associated with integrated circuits (ICs), simulation is widely used in IC design. Current digital simulators include those based on the Verilog hardware description language (HDL) and the VHDL (VHSIC hardware description language; VHSIC: very-high-speed integrated circuit) hardware description language.

Field-Programmable Gate Arrays (FPGAs) are often used to simulate digital circuits. The VHDL and/or Verilog code that describes the digital logic can be synthesized for an FPGA platform, and then run for a very large number of cycles to observe its behavior.

SUMMARY OF THE INVENTION

Principles of the invention provide techniques for cycle-reproducible simulation on large scale digital circuits on a coordinated set of FPGAs. In one aspect, an exemplary apparatus includes a plurality of target field programmable gate arrays interconnected in accordance with a connection topology and mapping portions of a target system; a control module coupled to the plurality of target field programmable gate arrays; a balanced clock distribution network configured to distribute a reference clock signal; and a balanced reset distribution network coupled to the control module and configured to distribute a reset signal to the plurality of target field programmable gate arrays. The control module and the balanced reset distribution network are cooperatively configured to initiate and control a simulation of the target system with the plurality of target field programmable gate arrays. A plurality of local clock control state machines reside in the target field programmable gate arrays. The local clock control state machines are coupled to the balanced clock distribution network and obtain the reference clock signal therefrom. The plurality of local clock control state machines are configured to generate a set of synchronized free-running and stoppable clocks to maintain cycle-accurate and cycle-reproducible execution of the simulation of the target system.

In another aspect, an exemplary method includes programming a plurality of target field programmable gate arrays to map portions of a target system; initializing a plurality of local clock control state machines residing in the target field programmable gate arrays; and training serial communication links which interconnect the plurality of target field programmable gate arrays in accordance with a connection topology, such that the links are free-running and synchronized, and configured to guarantee transfer of a new sample of multiplexed target system signals between two communicating ones of the plurality of target field programmable gate arrays in one target system clock cycle. Additional steps include loading test code for conducting a simulation of the target system into at least one external memory device accessible to the plurality of target field programmable gate arrays; and simulating the target system with the plurality of target field programmable gate arrays, in a cycle-reproducible manner, under control of the test code.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer readable program code configured to perform the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a computer readable storage medium (or multiple such media).

Some embodiments of the invention are directed to design structures for circuits used in simulation of integrated circuit designs and/or to the circuit designs.

Techniques of the present invention can provide substantial beneficial technical effects. For example, one or more embodiments provide high-speed, cycle-accurate simulation.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
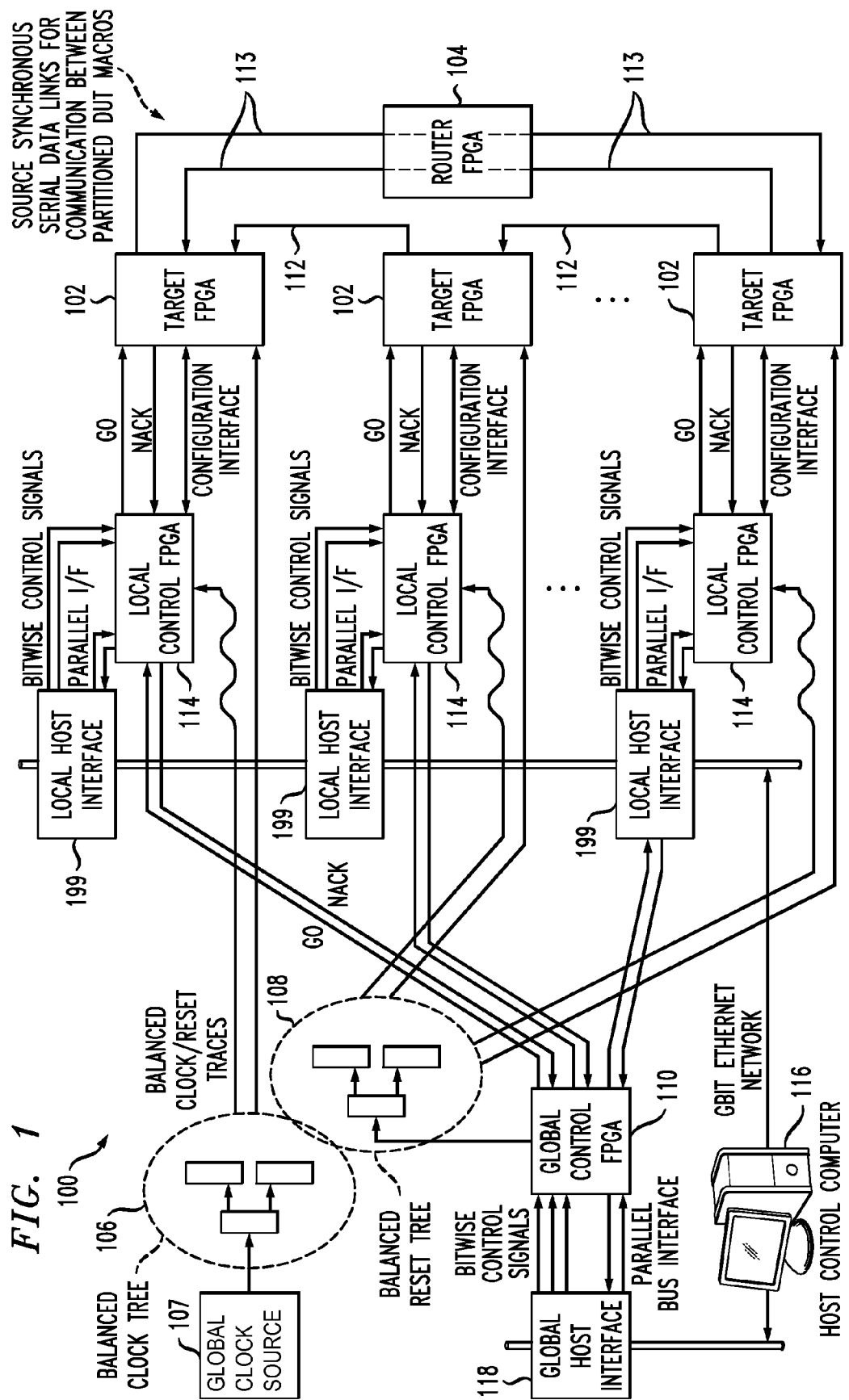
FIG. 1 depicts an exemplary system, according to an aspect of the invention.

Simulation of large digital circuits can be efficiently implemented with "cycle simulators," in which only events at latch boundaries are computed. Even though cycle simulators are usually implemented in software, there are many types of hardware accelerators that significantly increase the performance of the simulator.

Accelerating the simulation may be desirable for a number of reasons. The number of simulations to be performed to validate a large digital chip is very large. To complete those simulations in a reasonable time, a large number of computers have to be employed, with the corresponding associated cost. An accelerated simulator reduces this number. Furthermore, it is often necessary to simulate a circuit for a very long time before getting to the point of interest. This long simulation is a sequential process that may take several days for a software implementation, and cannot be sped up by just using more computers. One or more embodiments reduce this latency to the point of interest (that is, the latency is low enough such that the simulation speed is high enough to compare favorably with alternatives). By way of explanation, in a cycle-accurate system, added latency results in a penalty in cycle time. Since cycle accuracy is desired, information should be propagated everywhere, and the longer the information takes to get everywhere, the slower the system should be run.

One significant aspect of cycle simulators is "Cycle Reproducibility." Every time that the simulation is performed with exactly the same stimulus, exactly the same results should be obtained by the simulator. In some instances, for example, the system might be running the simulation at different levels of optimization. At the highest level of optimization, the simulation runs very fast, and is used to check that nothing is wrong. If something is wrong, though, and the optimized simulation flags it, it is desirable to reproduce this simulation at a lower level of optimization that leaves a good trace for circuit debugging. The two simulations should behave exactly the same, or it would not be feasible to debug the circuit in this manner. Even though this cycle reproducibility property is usually easy to ensure in software implementations of the simulator, it becomes a significant issue when the software technique is replaced with a hardware accelerator technique. In one or more cases, this aspect is one of the more severe limitations on how much it is possible to speed-up the simulation of a digital circuit.

FPGAs are often used to simulate digital circuits. The VHDL and/or Verilog code (or other similar code) that describes the digital logic can be synthesized for an FPGA platform, and then run for a very large number of cycles to observe its behavior. In one or more cases, this requires significant work and infrastructure. Large digital circuits are typically much larger than that which can be implemented into a single FPGA, requiring anywhere between 10 and 100 of the largest FPGAs available in current technology. Furthermore, in one or more cases, "just running a large number of cycles" is inappropriate. It is often desirable to single step, create traces, modify register values, and/or carry out any one, some, or all of the other operations that are common in a modern simulation environment.

A simulator implemented using a large number of FPGAs typically requires that all of these FPGAs are coordinated in such a way that the different parts of the digital circuit under test are in lockstep, and remain in lockstep even when asynchronous simulation events might be occurring: a request for attention from one FPGA, for example, needs to propagate to all of the FPGAs in the simulator by the end of the current cycle, so that cycle-accurate information is preserved and can be scanned (or otherwise read) out of the simulator. This represents one manner in which assertion, print statements, and single stepping, among other features, can be implemented in the simulator.

Because FPGAs typically have a very limited amount of input-output (I/O) relative to what would be available between two sub-circuits implemented on the same chip, the simulator infrastructure has to make up for this deficiency; for example, by time-multiplexing the available I/O to what is necessary to implement the full connectivity required by the design. Many arrangements are possible, but the basic properties of cycle-reproducibility and single-cycle reaction time to simulator events are preferably guaranteed.

One or more embodiments include a number of circuits and synchronization protocols to be implemented in an FPGA simulator infrastructure, which allow a large number of FPGAs to synchronize on a cycle-by-cycle basis, allow for single stepping, allow any FPGA in the system to stop the simulation by the end of the current cycle, and/or guarantee cycle-reproducibility of the simulation independently of how it is being run.

In one or more instances, the circuits used for synchronization can be broken up into the following categories; namely, high-speed clock, startup circuits, continuously running circuits, and circuits running only during simulation. Startup circuits create a global synchronous state at the beginning of the simulation. They include global reset synchronization, global clock synchronization, serial link bring-up, and the like. Continuously running circuits start running after the start-up circuits have finished initial synchronization, and keep running whether the simulation is advancing or not. These circuits include the serial links themselves, clock handshake sampling, simulation command processing, and the like. Circuits running only during simulation are active only while the simulation is active. They include all of the functional stoppable clocks, simulation counters, and the like.

High Speed Clock: A high speed clock is used pervasively in one or more embodiments of the simulator. This high speed clock is centrally generated and propagated to all FPGAs in the system. Global signals are synchronized to this clock. Serial links use this clock as the highest available clock rate in the system.

Start-up circuits: In one or more embodiments, a global reset signal is sent to every FPGA in the system. This global reset signal is synchronized with the High Speed Clock. No assumption is made as to whether all FPGAs receive this signal at the same time. An allowance is made for plus/minus one High Speed clock cycle, to eliminate the dependency of the system on global synchrony. This global reset signal resets and starts the start-up infrastructure: divided down clocks, serial links, and the like. From this reset signal, it is known that all systems in the simulator have started within plus/minus one high-speed clock cycle. Serial link bring-up can occur at this point. In one or more embodiments, the serial link protocol will contain enough elasticity to account for that clock cycle of uncertainty. All divided down clocks are synchronized across FPGAs to within plus/minus one high speed clock cycle as well, and the serial links absorb the difference.

Continuously Running Circuits: The nature of the continuously running circuits is varied, but it includes everything that cannot be stopped. Serial links, after they have been brought up, typically have to stay up. If the simulator has memory links as well, those typically also need to be continuously maintained (for link alignment, refresh, and other similar issues). Other continuously running circuits include the clock handshake circuits, and the simulation commands circuits. Clock handshake starts and stops the global clock from every FPGA. Because of their very nature, in one or more embodiments, they are always active. In at least some instances, there are two parts to the clock handshake. At the end of every simulation cycle, a signal is generated in every FPGA indicating whether any event happened that requires stopping the simulation clock. If no event happened, the simulation clock remains under central control. If some event happened, all of the clocks are stopped, and, depending on implementation, software control may be necessary to service that particular event.

Circuits Running During Simulation Only: The device under test (DUT) typically requires that a number of clock signals be generated, in the same way as a cycle simulator will generate clock signals based on the simulation clock. These signals are active only when the simulation is active. To keep track of the simulation state, counters are used to count the number of cycles that have already occurred. Simulation control allows these cycles to progress one by one (single step) or free running. In one or more embodiments, because all of these cycles are interlocked, and because no cycles are unaccounted for, the state of the simulation is dependent exclusively on the cycle counter, as there is no non-determinism left in the system.

One or more embodiments thus allow for cycle-reproducible simulation of very large digital circuits on a multi-FPGA based system, which is scalable and controllable on a cycle-by-cycle basis. Furthermore, one or more embodiments provide a simulating environment including FPGAs and having cycle-accurate and cycle-reproducible behavior for a large set of FPGAs for mapping a target system. In addition, one or more embodiments advantageously allow software developers to verify designs prior to construction of a computing machine, such as a massively parallel supercomputer or the like.

Further, one or more embodiments provide cycle-reproducible simulation of digital circuits using an FPGA-based hardware accelerator, with reduced power consumption, reduced cost, and/or enhanced speed (up to several orders of magnitude) as compared to current techniques. Advantageously, one or more instances allow for controllable and observable efficient simulation of a large digital system by partitioning the circuit among multiple FPGAs, and providing an infrastructure that allows for the synchronization of a very large group of FPGAs and that removes non-determinism of the system.

Reference should now be had to FIG. 1, which depicts an exemplary system 100, according to an aspect of the invention. One or more embodiments achieve cycle-accurate and cycle-reproducible behavior on a large set of FPGA devices. As seen in FIG. 1, the exemplary system 100 includes a number of "target" FPGA devices 102 (discussed further below in connection with FIG. 2) for mapping partitions of the simulated device-under-test (DUT), i.e., the target system.

In some instances, router FPGA 104 can also be used to map portions of the DUT, i.e., router FPGA 104, in at least some instances, need not be used exclusively for through-channel routing. Through-channel routing using router FPGA 104 maintains the cycle-accurate behavior of the system without performance degradation by avoiding the necessity to de-multiplex the signals down to the final (slow) DUT clock rates.

Balanced (low skew) clock and reset networks 106, 108 help achieve a high performance cycle-accurate and cycle-reproducible system. In one or more embodiments, cycle-reproducible execution control is provided using a global controller such as Global Control FPGA 110 and a set of control and/or status signals (e.g., go/nack).

Figure 2:
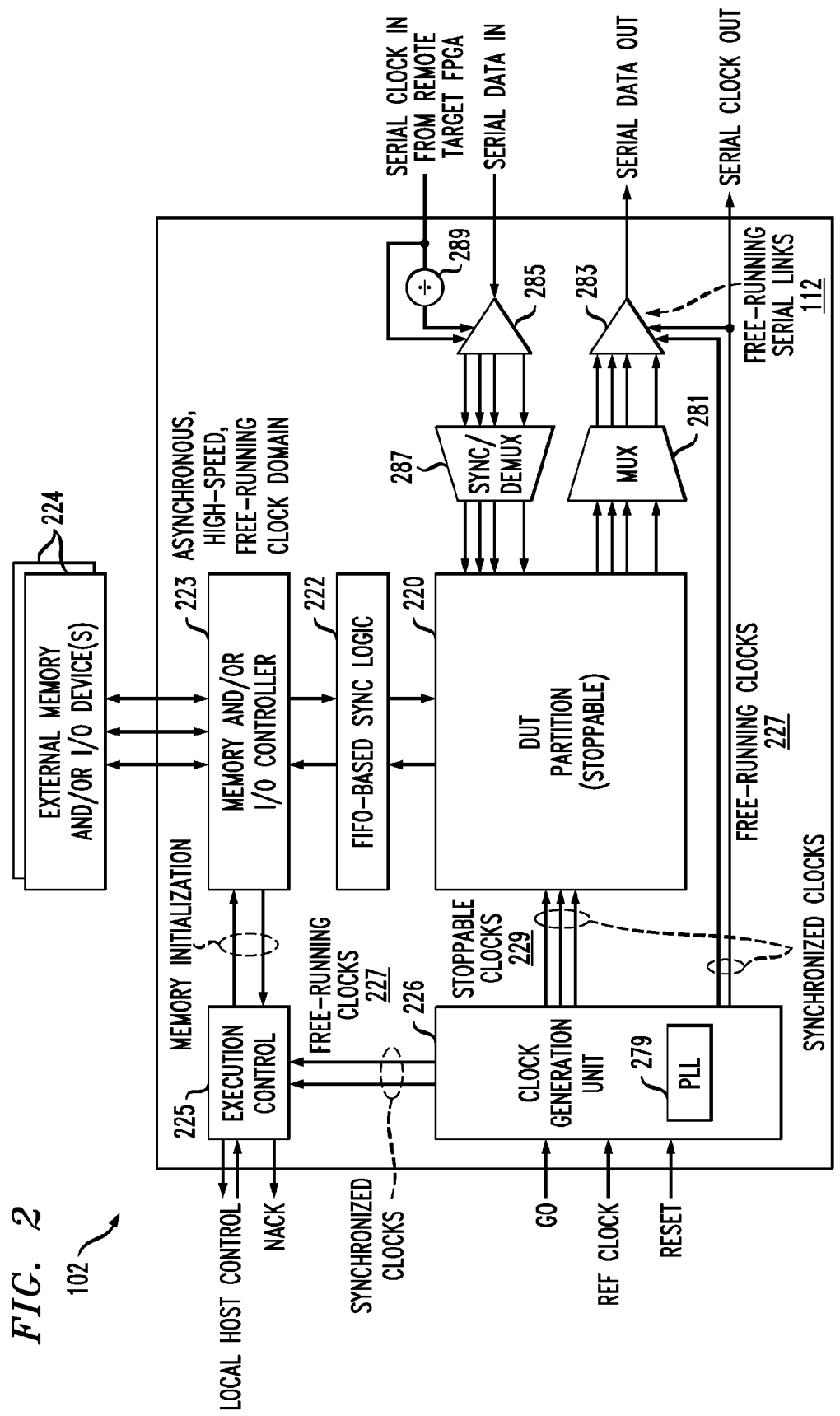
FIG. 2 depicts an exemplary target FPGA architecture, according to an aspect of the invention.

FIG. 2 depicts an exemplary architecture of a "target" FPGA device 102. The DUT (here, DUT partition 220) can be stopped at any DUT clock cycle, while the infrastructure logic (discussed elsewhere herein) is free-running. The DUT resumes when the same relationship (state) of clock waveforms repeats. In one or more embodiments, lock-step, free running, external interfaces are synchronized using wait states. Wait states (configurable) are proportional to the worst case skew in the system clock and reset networks 106, 108. Fully asynchronous external interfaces are synchronized using first-in-first-out (FIFO) structures 222. Assuming that external interfaces run at a much higher frequency, the data is ready in 1 DUT clock. The architecture can also be employed with lower external frequencies by adding enough wait states to guarantee cycle-reproducible behavior (sacrificing cycle-accuracy). In addition to the target FPGA devices 102, the exemplary system also includes a set of point-to-point free running serial communication links 112 and 113 that connect the target FPGA devices 102 with each other according to an appropriate topology. Ideally, the connection topology mimics that of the DUT architecture, but this is not a requirement.

In some instances, optional free running external memory (e.g. SRAM or DRAM) and/or I/O devices 224 and/or interface(s) 223 to external memory and/or I/O devices are provided. Note that, in the example, memory controller 223 is between FIFO-based sync logic 222 and external memory devices 224, within an asynchronous, high-speed, free-running clock domain. Execution control block 225 interacts with a corresponding local host control FPGA 114 and is configured to return the nack signal thereto. Execution control block 225 also carries out memory initialization via memory controller 223.

Additional exemplary details regarding data links 112, 113 are provided at the right-hand side of FIG. 2. Note the serial clock out, as well as the serial data out resulting from multiplexer 281 and serializer 283. Note also the serial data in and the serial clock in from a remote target FPGA 102. The serial data in is provided to deserializer 285 and synchronizer-demultiplexer 287. Note that the serial clock in can be input to a divider block 289 to obtain derived clocks with lower frequencies.

As noted, in some cases, optional FPGA devices in the system act as "router" devices 104, to increase routability beyond direct point-to-point links 112 (as indicated at 113, source synchronous serial data links for communication between partitioned DUT macros). Single stage and/or multiple routing stages can be employed, providing a trade-off between routing flexibility and system performance.

In one or more embodiments, a hierarchical network of "control" FPGA devices is provided for controlling the configuration and execution of the system. The control hierarchy has a single global control device (e.g., global control FPGA 110 interfacing with host control computer 116 through global host interface 118) and one or more local control devices 114. In one or more instances, the global control device 110 is the central point of system control functions, including starting, stopping, and single-stepping the simulation under host software control (e.g., software running on host 116). Global control device 110 also receives and aggregates service request events (nack) from all local control devices 114 to stop simulation for various service and/or error reporting events coming from the target FPGA devices 102. The local control FPGA devices 114 are responsible for direct control of the subset of target FPGA devices 102 they are connected to, including downloading target FPGA configuration, memory image initialization, and forwarding system control commands from and to the global control device 110. Note that local control FPGAs 114 can, in some cases, control more than one target FPGA 102.

One or more embodiments also include a balanced clock distribution network that distributes a reference clock (e.g., global clock source 107) to all FPGA devices in the system with a low skew. This reference clock can either be the highest clock frequency in the system, or a reference to generate the highest clock frequency in the system using phase-locked loop (PLL) units in each FPGA device as the first stage of local clock generation. Note balanced clock tree 106 with balanced clock/reset traces to local control FPGA 114 and target FPGA 102. In one or more instances, a balanced reset distribution network is provided, which distributes a level-sensitive reset signal to all FPGA devices in the system with a low skew. Note balanced reset tree 108 with balanced clock/reset traces to local control FPGA 114 and target FPGA 102 (to avoid cluttering the drawing, some traces are shown emanating from 108 and some from 106). Note also clock generation unit 226 in FIG. 2, which can include the aforementioned PLL, numbered as 279.

Still with reference to FIG. 1, note that in the illustrative embodiment, global host interface 118 is provided with a parallel bus interface to global control FPGA 110, and also provides bitwise control signals thereto. Host control computer 116 is coupled to local host interfaces 119; for example, via a Gigabit Ethernet network. Furthermore, each local host interface 199 is provided with a parallel interface to the corresponding local control FPGA 114, and also provides bitwise control signals thereto. Each local control FPGA 114 is provided with a configuration interface to the corresponding target FPGA 102, and can send the go signal thereto and receive the nack signal therefrom.

Figure 3:
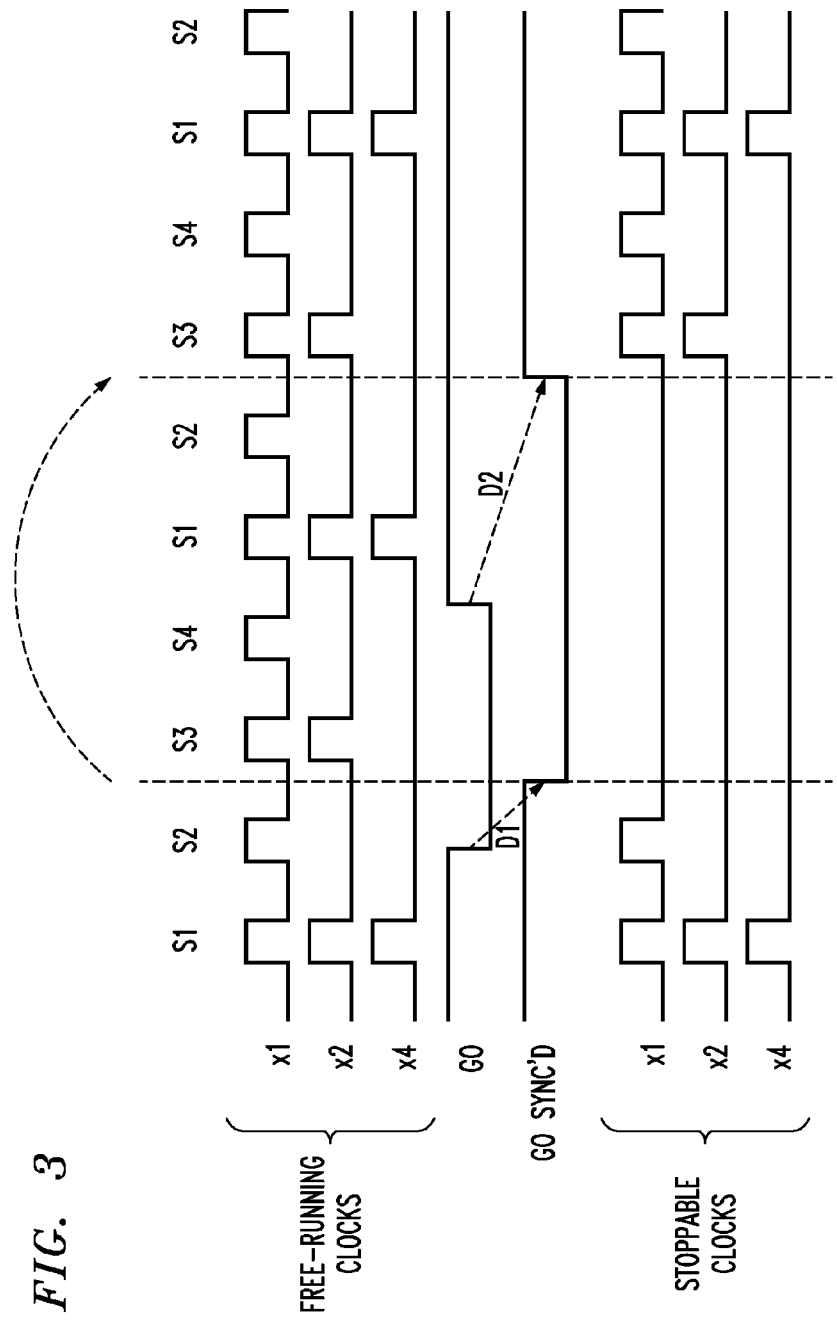
FIG. 3 shows exemplary cycle-reproducible execution control using free-running (infrastructure) and stoppable (DUT) clocks, according to an aspect of the invention.

In some cases, as seen in FIG. 2, local clock control state machines 226 reside in the target FPGA devices 102. These are identical circuits distributed one in each target FPGA. FIG. 3 shows synchronizing free-running clock signals with stoppable clock signals. As seen therein, clock phases are generated using a synchronous state machine controller 226 so they all run in lockstep (simplified version with four states S1, S2, S3, S4 shown for clarity). In one or more instances, state machine controller 226 is quite flexible, enabling the generation of any rational set of clock frequencies while maintaining phase. In at least some cases, the "go" signal from the global controller 110 can be asserted and/or de-asserted at any time to start and/or stop the execution of the simulation. As seen at D1 in FIG. 3, internal to the clock controller, the de-assertion of the go signal is delayed to the first inactive portion (low) of the clock, avoiding potential clock pulse glitches. Furthermore, as also seen in FIG. 3, the rising edge of the go signal is delayed by D2 to allow the stoppable clocks to resume at the correct state. In this figure, clocks stopped after S2 and can only be resumed to continue with S3. Derived clocks with lower frequencies (e.g. ×2, ×4 as compared to ×1)) are produced by dropping pulses, rather than keeping a 50% duty cycle. The advantage of this scheme is to guarantee time periods when all clocks are inactive (low), which serve as opportune windows in time to start and/or stop the clock state machine in a glitch-free manner.

In addition to the global go signal, unit 226 also receives a ref clock signal from 106, 107 and can receive a reset signal from 108.

Figure 4:
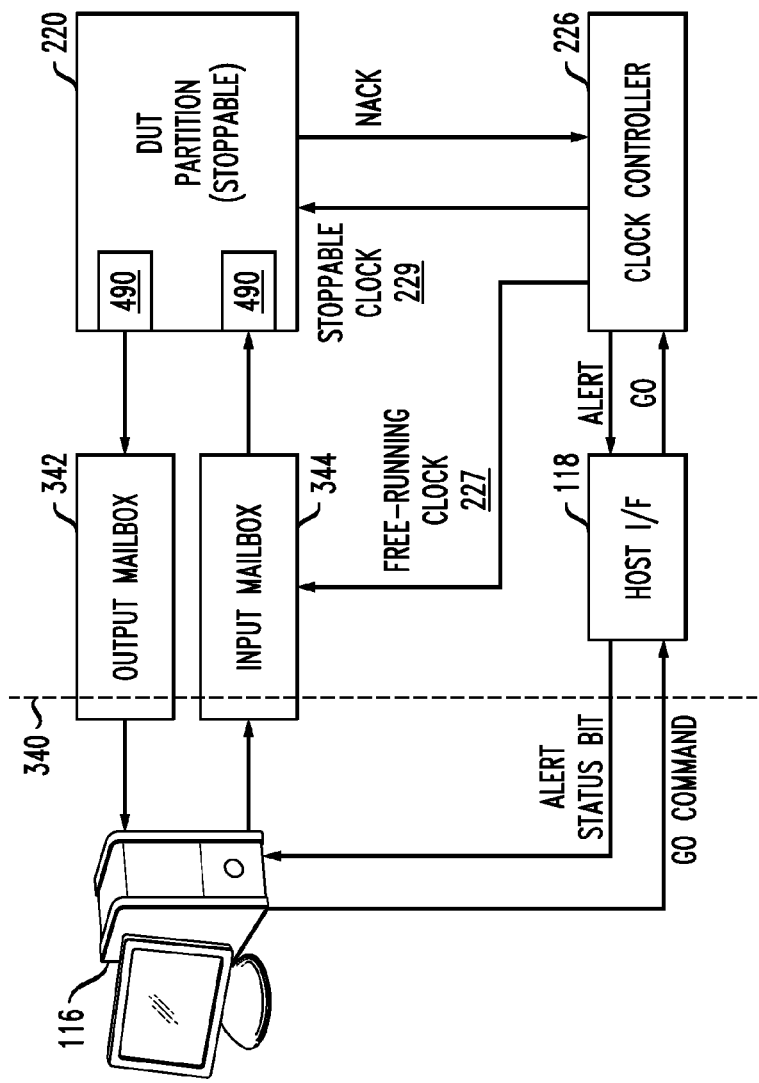
FIG. 4 shows exemplary cycle-reproducible communication and/or synchronization between an FPGA system containing a DUT and an external, variable-latency system, according to an aspect of the invention.

In one or more instances, a significant purpose of the state machines 226 is to generate a set of synchronized free-running and stoppable clocks 227, 229 to maintain cycle-accurate and cycle-reproducible execution of the target simulation, as shown in FIG. 4, which depicts exemplary cycle-reproducible communication and/or synchronization between an FPGA system containing a DUT and an external, variable-latency system, according to an aspect of the invention. Note that elements to the left of line 340 represent variable latency and/or asynchronous execution, while elements to the right of line 340 represent cycle-reproducible execution (e.g., in DUT partition 220). In one or more embodiments, one aspect involves sending data from DUT 220 to host 116. DUT 220 saves the data in output mailbox 342. DUT 220 asserts nack to clock controller 226. Clock controller 226 stops the DUT clock. Note that the number of DUT clock cycles needed from the assertion of the DUT nack to stopping the DUT clock depends on the system implementation, but should be fixed and reproducible. The clock controller 226 can typically only proceed to alert the host system after the DUT clock has stopped, to avoid any potential race condition.

Clock controller 226 signals alert to host 116 by setting a host readable status bit in Host interface (I/F) 118. Host 116 reads data from output mailbox 342 asynchronously. Host 116 issues a "go" command to Host I/F 118. Host I/F 118 raises a "go" signal to clock controller 226 to resume DUT operation. Clock controller 226 resumes clock to DUT 220 in a cycle-reproducible manner as described before.

In one or more embodiments, another aspect involves sending data from host 116 to DUT 220. Host 116 puts the FPGA simulator in an idle state. Note that the FPGA system is under the control of the host system 116 from the first cycle. The host therefore has full knowledge of the current cycle count of the simulated DUT clock at any time and can interrogate the status of the FPGA system by reading the appropriate status registers in the host I/F 118 of the FPGA system. The go signal is de-asserted from host I/F 118 to clock controller 226. The host sends data to input mailbox 344 asynchronously. Host 116 sends control commands instructing infrastructure logic 490 to use the data. Infrastructure logic 490 resides in the FPGA system to handle the incoming host data according to the system needs. Host 116 asserts the "go" command to resume DUT operation.

A non-limiting exemplary sequence of operation will now be described. Upon system power-on, the host control software in host 116 downloads the configuration of the global control FPGA device 110, followed by that of the local control FPGA devices 114, and finally the target FPGA devices 102. The host control software then sends a hardware reset command that gets propagated as a level sensitive signal on the reset network to all FPGA devices in the system. This hardware reset is used to initialize all clock control state machines, start the training sequence of all serial communication links in the system, and the initialization of external DRAM interfaces. The completion of the link initialization sequence and the DRAM subsystem initialization is communicated back to the host controller by setting corresponding status bits readable by the host control software in a polling fashion.

Upon successful completion of the initialization sequence, all links are free-running and synchronized, guaranteeing the transfer of a new sample of multiplexed DUT signals between two communicating target FPGAs in one DUT clock cycle. All DUT clocks are stopped (in idle state) awaiting further commands from the host. External DRAM interfaces are initialized and ready for use.

The host control software then typically downloads the test code onto the external DRAM, using a back door accessible through the network of control FPGAs. Upon completion of this step, the host control software sends commands to start the simulation execution of the target system, e.g. "Run 1000 cycles." The global control FPGA translates this command to a "go" pulse that has a duration of 1000 DUT clock cycles. The local control FPGAs perform the fine grain timing to carry this command through in a cycle-reproducible manner as explained in the text accompanying FIG. 3.

While the FPGA system is running, the host control software can read the current status at any time. This includes information on the current cycle of execution, as well as status on the proper operation of the links. If an exception occurs in the target system resulting in a "nack" signal being asserted, the DUT clocks stop and the appropriate status bits arc set to inform the host controller. Again, this happens in a cycle-reproducible manner as detailed in FIGS. 4 and 5 and accompanying text.

Figure 5:
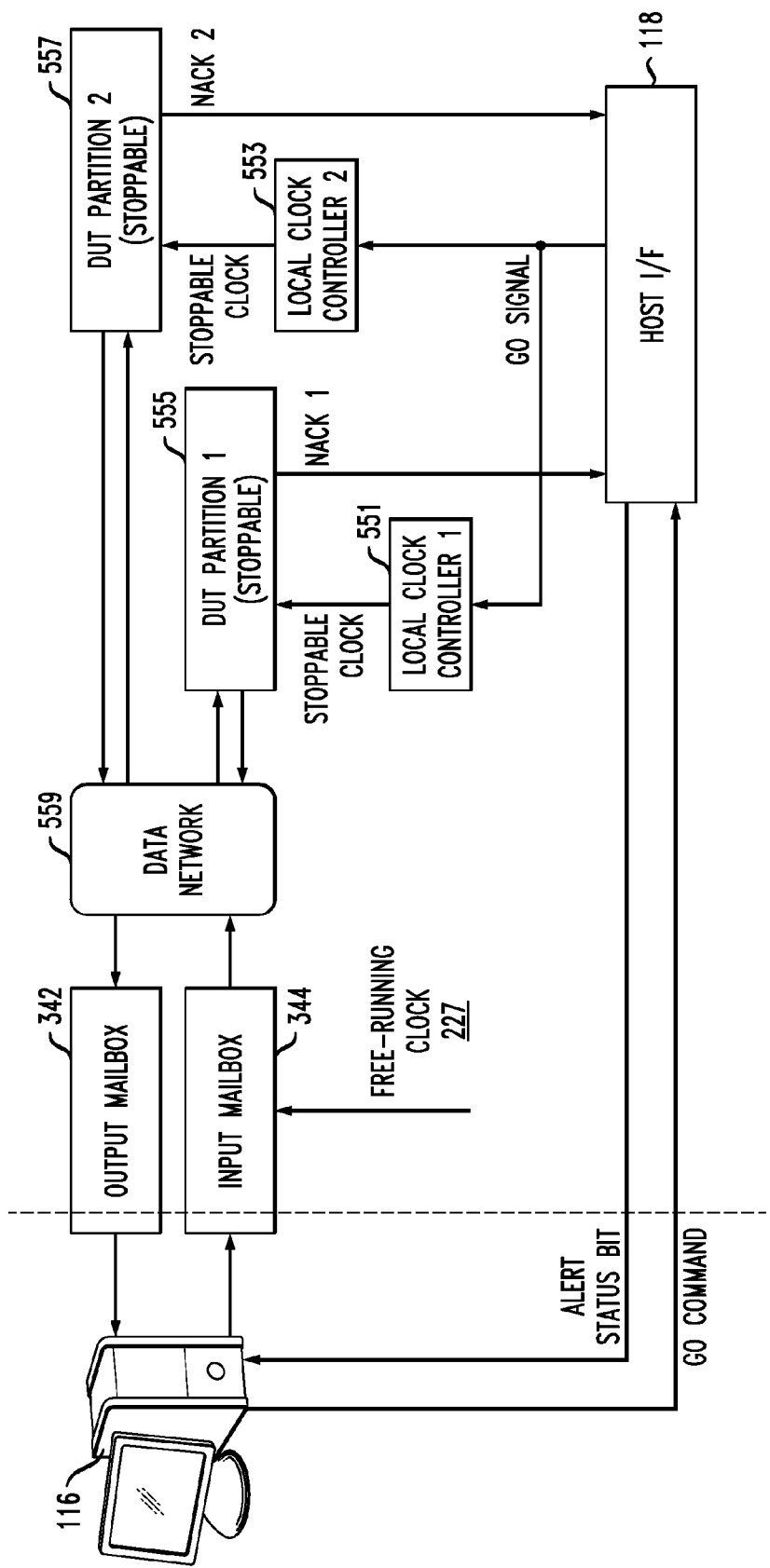
FIG. 5 shows exemplary cycle-reproducible communication and/or synchronization between an FPGA system containing a DUT and an external, variable-latency system, in a case with multiple target FPGAs, according to an aspect of the invention.

In this regard, FIG. 5 shows exemplary cycle-reproducible communication and/or synchronization between an FPGA system containing a DUT and an external, variable-latency system, in a case with multiple target FPGAs, according to an aspect of the invention. In one or more embodiments, there are one or more changes relative to a single target FPGA case. In particular, different DUT partitions 555. 557 are mapped to different target FPGA devices. The partitions are in communication with mailboxes 342, 344 via data network 559. Any DUT partition can raise "nack" to request service (e.g., nack1, nack2). Nacks from target FPGA devices are routed to the host I/F 118, which merges all nack sources. The merged nack is used to stop all local clock controllers by de-asserting the go signal between the host I/F 118 and local controllers 551, 553.

Various exemplary applications will now be discussed.

Run for N cycles: Host system 116 sends a command to global execution controller 110 to run for N cycles. Global execution controller will raise the "go" signal for the specified number of DUT cycles, then de-assert go. Local clock controllers 551, 553 will start and/or stop the clocks to the DUT synchronously to achieve the desired N clock cycles of execution.

Single-step: Single step can be implemented, for example, as "Run for 1 cycle."

Breakpoint: Host controller 116 programs infrastructure logic with the conditions that the system should break on. Infrastructure logic, discussed elsewhere herein, implements a state machine controller that raises "nack" to global clock control when the break condition is met.

Cycle-reproducible "printf": Printing from a CPU model running as DUT on the FPGA platform uses the mailbox to store the print data in the output mailbox 342, and then raise "nack" to alert the host system. During a printf, an asynchronous communication takes place; in a real system, the same is not cycle-reproducible. However, in one or more embodiments, cycle-reproducibility with respect to a printf is possible, as whenever the machine is stopped, it is known when the printf occurs and in which cycle (occurs in same cycle). Note the alert in FIG. 4, which can be used to synchronize the output mailbox 342. When a printf output operation occurs, an alert is generated, and no other processing occurs until the printf is handled, thus achieving cycle reproducibility.

Cycle-reproducible JTAG communication between host and DUT: JTAG is part of the DUT; when simulating the DUT, JTAG should also be simulated. In some instances, the JTAG link is used to program the DUT; i.e., use the simulator to program itself.

It should be noted that a replay of the same test under the same initial conditions should result in an identical execution trace by the system. This is achieved by removing all uncertainties from the clocking and external stimuli from the system, which is a significant aspect of one or more embodiments. Cycle-reproducible behavior is an important feature for debugging subtle bugs in the target DUT, whereby the system can re-run the same test and collect waveform trace samples at varying granularity. Typically, one would collect short snapshots at regular intervals in the beginning to help narrow down the period where the fault originates. When the region of interest has been identified, a more complete waveform trace in this (short) region is generated by another replay. This is then used to uncover the bug. In the absence of cycle reproducible operation, this replay would not be possible, rendering the debug of the DUT much harder. A brute-force complete waveform generation of the whole simulation is impractical because of the reduced execution while generating waveforms.

As noted, one or more embodiments provide high-speed, cycle-accurate simulation. For example, in the case of a microprocessor, actual software can be run (such as booting an operating system or simulating execution of a large piece of code). Heretofore, these types of functions could not be performed in a cycle-accurate manner. Typically, quite a number of cycles occur before a program begins to carry out instructions of interest, but prior techniques have typically involved conducting only a very short simulation. Embodiments of the invention have, in experiments, successfully simulated booting of the Linux® operating system (registered mark of Linus Torvalds) on a microprocessor.

Given the discussion thus far, it will be appreciated that, in general terms, an exemplary apparatus, according to an aspect of the invention, includes a plurality of target field programmable gate arrays 102 interconnected in accordance with a connection topology and mapping portions of a target system, as well as a control module coupled to the plurality of target field programmable gate arrays. In a non-limiting example, the control module includes a host control computer 116 executing host control software, a global control field programmable gate array 110 coupled to the host control computer, and at least a first local control field programmable gate array 114 coupled to the global control field programmable gate array and at least a first portion of the plurality of target field programmable gate arrays 102. Additional elements include a balanced clock distribution network 106 configured to distribute a reference clock signal 107, and a balanced reset distribution network 108 coupled to the control module and configured to distribute a reset signal to the plurality of target field programmable gate arrays.

The control module and the balanced reset distribution network are cooperatively configured to initiate and control a simulation of the target system with the plurality of target field programmable gate arrays.

Also included are a plurality of local clock control state machines 226 residing in the target field programmable gate arrays 102. The local clock control state machines are coupled to the balanced clock distribution network and obtaining the reference clock signal therefrom. The plurality of local clock control state machines are configured to generate a set of synchronized free-running and stoppable clocks 227, 229 to maintain cycle-accurate and cycle-reproducible execution of the simulation of the target system.

In some cases, the apparatus further includes a set of point-to-point free running serial communication links 112. The set of point-to-point free running serial communication links interconnect the plurality of target field programmable gate arrays 102 in accordance with the connection topology.

In some embodiments, the connection topology mimics that of the target system.

As noted, in some cases, the control module in turn includes a host control computer 116 executing host control software, a global control field programmable gate array 110 coupled to the host control computer, and at least a first local control field programmable gate array 114 coupled to the global control field programmable gate array and at least a first portion of the plurality of target field programmable gate arrays. In at least some such cases, the global control field programmable gate array 110 is configured to initiate, stop, and single-step the simulation of the target system under control of the host control software, and the at least first local control field programmable gate array 114 is configured to directly control the at least first portion of the plurality of target field programmable gate arrays and to forward system control commands from and to the global control field programmable gate array.

In some cases, there are two or more local control field programmable gate arrays 114 coupled to the global control field programmable gate array 110; each can control one or more of the target field programmable gate arrays 102. In at least some such cases, the global control field programmable gate array 110 is further configured to receive and aggregate service request events from the local control field programmable gate arrays, and to stop simulation for at least one of service and error reporting events emanating from the plurality of target field programmable gate arrays, and the local control field programmable gate arrays are responsible for direct control of corresponding portions (one or more) of the plurality of target field programmable gate arrays.

In at least some cases, direct control of the corresponding portions of the plurality of target field programmable gate arrays by the local control field programmable gate arrays includes downloading target field programmable gate array configuration and memory image initialization.

In one or more embodiments, the balanced clock distribution network 106 distributes the reference clock signal 107 with a low skew, and the balanced reset distribution network 108 distributes the reset signal with a low skew; the reset signal is, in one or more instances, a level-sensitive reset signal. As used, herein, "low skew" is relative to the reference clock signal, such that the total skew of the balanced reset distribution network 108, from the earliest arriving to the latest arriving, is small relative to the cycle time of the reference clock signal, so that it can be guaranteed that it arrives everywhere in more or less the same reference clock cycle.

In some instances, the reference clock signal 107 is the highest clock frequency in the apparatus; in other instances, the reference clock signal 107 is a reference to generate a highest clock frequency in the apparatus. In the latter instances, the apparatus further includes a plurality of phase-locked loops 279 in the plurality of target field programmable gate arrays 102; the plurality of phase-locked loops generate the highest clock frequency from the reference.

Some embodiments include at least one external memory device 224 accessible to the plurality of target field programmable gate arrays 102 and containing test code for conducting the simulation of the target system.

Some instances include at least one router field programmable gate array 104 interconnecting at least a portion of the target field programmable gate arrays 102.

Figure 8:
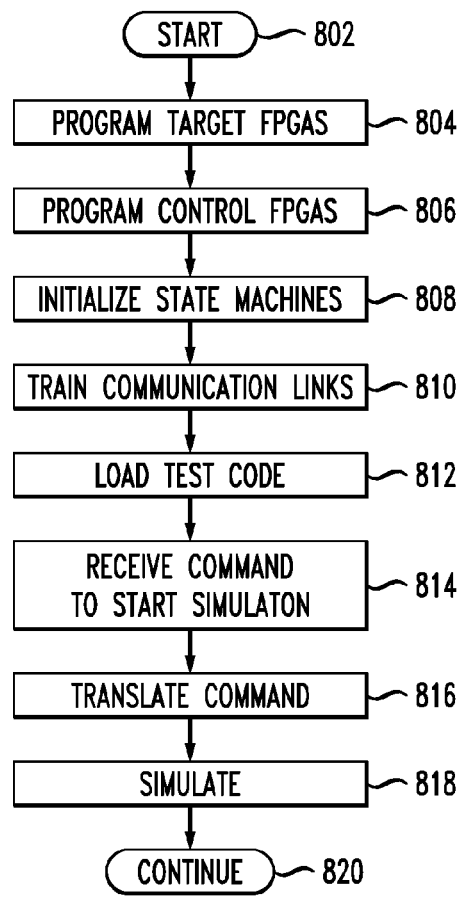
FIGS. 8 and 9 are flow charts illustrating exemplary method steps of aspects of the invention.

Furthermore, reference should now be had to the flow chart of FIG. 8, which begins in step 802. Given the discussion thus far, it will be appreciated that, in general terms, an exemplary method, according to another aspect of the invention, includes the step 804 of programming a plurality of target field programmable gate arrays 102 to map portions of a target system; the step 808 of initializing a plurality of local clock control state machines 226 residing in the target field programmable gate arrays, and the step 810 of training serial communication links 112 which interconnect the plurality of target field programmable gate arrays in accordance with a connection topology.

The links 112 are free-running and synchronized, and configured to guarantee transfer of a new sample of multiplexed target system signals between two communicating ones of the target field programmable gate arrays 102 in one target system clock cycle.

Additional steps include step 812, loading test code for conducting a simulation of the target system into at least one external memory device 224 accessible to the plurality of target field programmable gate arrays; and step 818, simulating the target system with the plurality of target field programmable gate arrays 102, in a cycle-reproducible manner, under control of the test code. Processing continues at 8120

An optional additional step 806 includes programming a global control field programmable gate array 110 and at least a first local control field programmable gate array 114. The global control field programmable gate array is coupled to a host control computer 116, and the at least first local control field programmable gate array 114 is coupled to the global control field programmable gate array and at least a first portion of the plurality of target field programmable gate arrays. Other optional additional steps include step 814, receiving, at the global control field programmable gate array 110, from the host control computer 116, a command to start the simulating step by running a predetermined number of clock cycles; and step 816, translating the command to start the simulating step to a "go" pulse that has a duration corresponding to the predetermined number of clock cycles, using the global control field programmable gate array 110.

In one or more instances: (i) the programming of the plurality of target field programmable gate arrays, and (ii) the programming of the global control field programmable gate array and the at least first local control field programmable gate array, include downloading (programming instructions or the like) from the host control computer.

Figure 9:
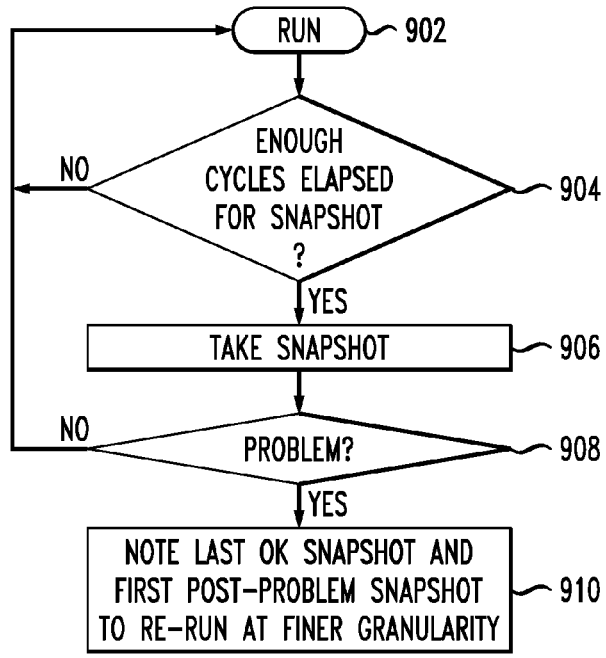

In some instances, the simulating includes collecting short snapshots at regular intervals to identify a period where a fault originates, and obtaining a more complete waveform trace in the identified period where the fault occurs, via a simulation replay at a finer granularity. For example, instead of taking a complete trace of the simulation, which takes a long time, take a snapshot every predetermined number of cycles (e.g., several thousand). Then, find the first snapshot where the fault occurs, and conduct a complete trace (cycle-by-cycle snapshots) between the last snapshot where everything was OK and the first snapshot where the fault was noted. Without cycle-reproducible simulation, this technique is not feasible. Refer to FIG. 9. As at 902, run the simulation, and check periodically, as per decision block 904, whether sufficient cycles have passed such that a snapshot is to be taken. If not, as per the NO arrow, continue to run. If YES, take the snapshot in step 906. In 908, check and see if a problem has occurred since the last snapshot; if not, as per the NO arrow, continue to run, whereas if there has been a problem, in 910, note the last snapshot before the fault and the first snapshot after the fault to allow the simulation replay at finer granularity.

Techniques described herein can be used in the design and/or simulation of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 6:
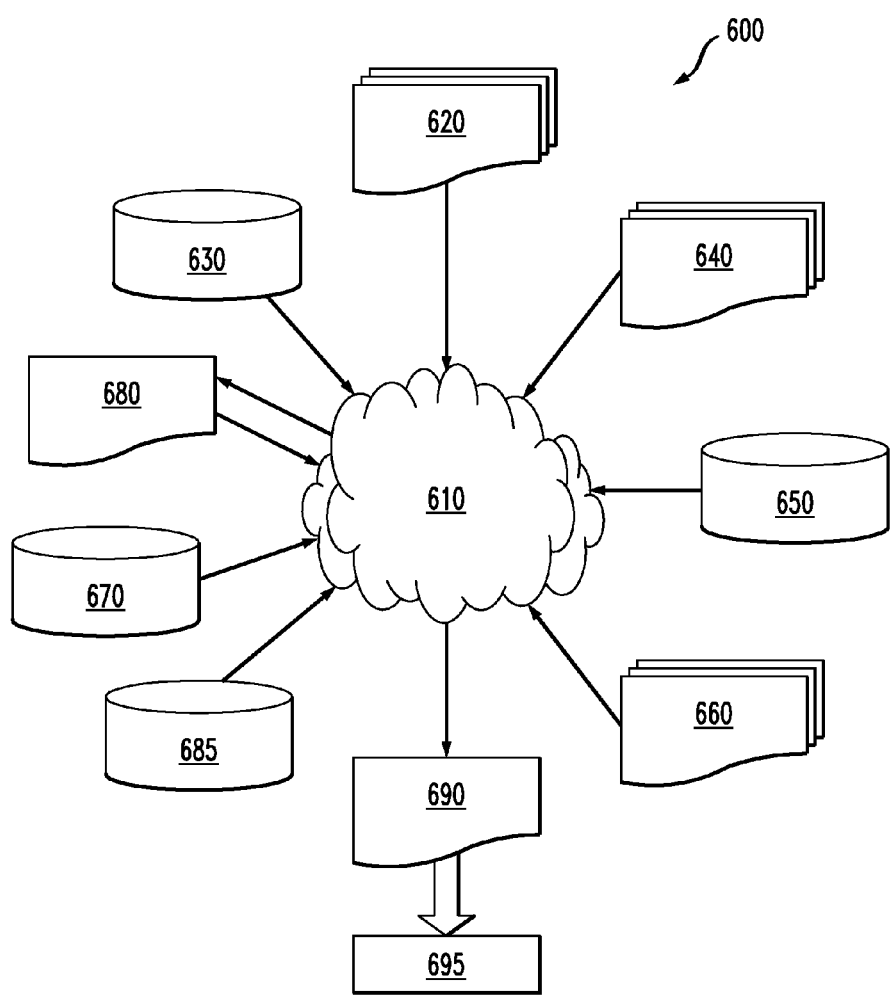
FIG. 6 is a flow diagram of a design process used in semiconductor design, manufacture, and/or test.

FIG. 6 shows a block diagram of an exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above and shown in FIGS. 1-5 (and/or circuits simulated using techniques described with respect to FIGS. 1-5). The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc. FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 1-5 (and/or circuits simulated using techniques described with respect to FIGS. 1-5). As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1-5 (and/or circuits simulated using techniques described with respect to FIGS. 1-5) to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g.

information stored in an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5 (and/or circuits simulated using techniques described with respect to FIGS. 1-5). In one embodiment, design structure 690 may comprise a compiled, executable HDL simulation model that functionally simulates the devices shown in FIGS. 1-5 (and/or circuits simulated using techniques described with respect to FIGS. 1-5).

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5 (and/or circuits simulated using techniques described with respect to FIGS. 1-5). Design structure 690 may then proceed to a stage 695 where, for example, design structure 690: proceeds to tape-out, is released to manufacturing, is released to a mask house, is sent to another design house, is sent back to the customer, etc.

Exemplary System and Article of Manufacture Details

As will be appreciated by one skilled in the art, aspects of the present invention may be embodied as a system, method or computer program product. Furthermore, aspects of the present invention may take the form of a computer program product embodied in one or more computer readable medium(s) having computer readable program code embodied thereon. In some instances, software resides on computer 116 and translates the simulation commands from the user into the simulator commands, as well as programming the various FPGAs in the system, interpretation of the input and output mailboxes, and scanning and generation of the snapshots.

One or more embodiments of the invention, or elements thereof, can be implemented in the form of an apparatus including a memory and at least one processor that is coupled to the memory and operative to perform exemplary method steps.

Figure 7:
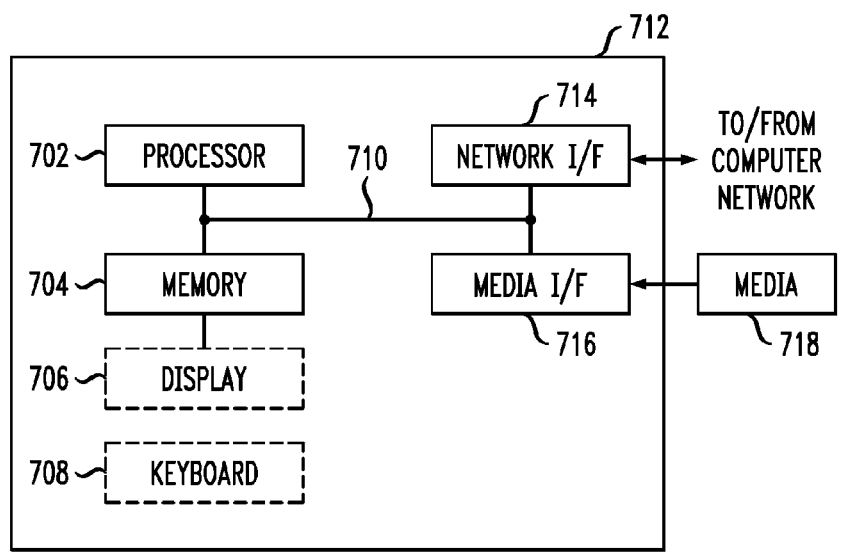
FIG. 7 depicts a computer system that may be useful in implementing one or more aspects and/or elements of the invention.

One or more embodiments can make use of software running on a general purpose computer or workstation. With reference to FIG. 7, such an implementation might employ, for example, a processor 702, a memory 704, and an input/output interface formed, for example, by a display 706 and a keyboard 708. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 702, memory 704, and input/output interface such as display 706 and keyboard 708 can be interconnected, for example, via bus 710 as part of a data processing unit 712. Suitable interconnections, for example via bus 710, can also be provided to a network interface 714, such as a network card, which can be provided to interface with a computer network, and to a media interface 716, such as a diskette or CD-ROM drive, which can be provided to interface with media 718.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 702 coupled directly or indirectly to memory elements 704 through a system bus 710. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 708, displays 706, pointing devices, and the like) can be coupled to the system either directly (such as via bus 710) or through intervening I/O controllers (omitted for clarity).

Network adapters such as network interface 714 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, z "server" includes a physical data processing system (for example, system 712 as shown in FIG. 7) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 718 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc. or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. One or more embodiments employ a hardware description language such as Verilog or VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and/or computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, an input command interpretation module, a network interface module, a data upload module, a data download module, and a command execution module. The method steps can then be carried out using the distinct software modules and/or sub-modules of the system, as described above, executing on one or more hardware processors 702. Further, a computer program product can include a computer-readable storage medium with code adapted to be implemented to carry out one or more method steps described herein, including the provision of the system with the distinct software modules. In some instances, the distinct software modules reside on computer 116 and translate the simulation commands from the user into the simulator commands, as well as programming the various FPGAs in the system, interpreting of the input and output mailboxes, and scanning and generation of the snapshots.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a plurality of target field programmable gate arrays interconnected in accordance with a connection topology and mapping portions of a target system;
a control module coupled to said plurality of target field programmable gate arrays;
a balanced clock distribution network configured to distribute a reference clock signal;
a balanced reset distribution network coupled to said control module and configured to distribute a reset signal to said plurality of target field programmable gate arrays, said control module and said balanced reset distribution network being cooperatively configured to initiate and control a simulation of said target system with said plurality of target field programmable gate arrays; and
a plurality of local clock control state machines residing in said target field programmable gate arrays, said local clock control state machines being coupled to said balanced clock distribution network and obtaining said reference clock signal therefrom, said plurality of local clock control state machines being configured to generate a set of stoppable clocks and a set of free-running clocks synchronized to the stoppable clocks to maintain cycle-accurate and cycle-reproducible execution of said simulation of said target system.

2. The apparatus of claim 1, further comprising a set of point-to-point free running serial communication links, wherein said set of point-to-point free running serial communication links interconnect said plurality of target field programmable gate arrays in accordance with said connection topology.

3. The apparatus of claim 2, wherein said connection topology mimics that of said target system.

4. The apparatus of claim 2, wherein said control module in turn comprises:
a host control computer executing host control software;
a global control field programmable gate array coupled to said host control computer; and
at least a first local control field programmable gate array coupled to said global control field programmable gate array and at least a first portion of said plurality of target field programmable gate arrays;
wherein:
said global control field programmable gate array is configured to initiate, stop, and single-step said simulation of said target system under control of said host control software; and
said at least first local control field programmable gate array is configured to directly control said at least first portion of said plurality of target field programmable gate arrays and to forward system control commands from and to said global control field programmable gate array.

5. The apparatus of claim 4, further comprising at least a second local control field programmable gate array coupled to said global control field programmable gate array and at least a second portion of said plurality of target field programmable gate arrays, wherein:
said global control field programmable gate array is further configured to receive and aggregate service request events from said at least first and second local control field programmable gate arrays, and to stop simulation for at least one of service and error reporting events emanating from said plurality of target field programmable gate arrays; and
said at least first and second local control field programmable gate arrays are responsible for direct control of said first and second portions of said plurality of target field programmable gate arrays, respectively.

6. The apparatus of claim 5, wherein said direct control of said first and second portions of said plurality of target field programmable gate arrays by said at least first and second local control field programmable gate arrays comprises downloading target field programmable gate array configuration and memory image initialization.

7. The apparatus of claim 4, wherein said host control software comprises distinct software modules, each of said distinct software modules being embodied on a computer-readable storage medium, and wherein said distinct software modules comprise an input command interpretation module, a network interface module, a data upload module, a data download module, and a command execution module.

8. The apparatus of claim 2, wherein: said balanced clock distribution network distributes said reference clock signal with a low skew; and
said balanced reset distribution network distributes said reset signal with a low skew, said reset signal comprising a level-sensitive reset signal.

9. The apparatus of claim 8, wherein said reference clock signal comprises a highest clock frequency in said apparatus.

10. The apparatus of claim 8, wherein said reference clock signal comprises a reference to generate a highest clock frequency in said apparatus, further comprising a plurality of phase-locked loops in said plurality of target field programmable gate arrays, said plurality of phase-locked loops generating said highest clock frequency from said reference.

11. The apparatus of claim 2, further comprising at least one external memory device accessible to said plurality of target field programmable gate arrays and containing test code for conducting said simulation of said target system.

12. The apparatus of claim 2, further comprising at least one router field programmable gate array interconnecting at least a portion of said target field programmable gate arrays.

13. A method comprising:
programming, by a processor, a plurality of target field programmable gate arrays to map portions of a target system;
initializing a plurality of local clock control state machines residing in said target field programmable gate arrays;
training serial communication links which interconnect said plurality of target field programmable gate arrays in accordance with a connection topology, such that said links are free-running and synchronized, and configured to guarantee transfer of a new sample of multiplexed target system signals between two communicating ones of said plurality of target field programmable gate arrays in one target system clock cycle;

loading test code for conducting a simulation of said target system into at least one external memory device accessible to said plurality of target field programmable gate arrays; and simulating said target system with said plurality of target field programmable gate arrays, in a cycle-reproducible manner, under control of said test code, wherein said plurality of target field programmable gate arrays each comprises a local clock generation unit and a device under test partition of said test system, said local clock generation unit generating a set of stoppable clocks supplied to said device under test partition and a set of free-running clocks, wherein said set of free-running clocks are synchronized to said set of stoppable clocks and each of said plurality of target field programmable gate arrays runs in lockstep according to said free-running clocks.

14. The method of claim 13, further comprising:

programming a global control field programmable gate array and at least a first local control field programmable gate array, said global control field programmable gate array being coupled to a host control computer, said at least first local control field programmable gate array being coupled to said global control field programmable gate array and at least a first portion of said plurality of target field programmable gate arrays;

receiving, at said global control field programmable gate array, from said host control computer, a command to start said simulating step by running a predetermined number of clock cycles; and translating said command to start said simulating step to a "go" pulse that has a duration corresponding to said predetermined number of clock cycles, using said global control field programmable gate array.

15. The method of claim 14, wherein: said programming of said plurality of target field programmable gate arrays, and said programming of said global control field programmable gate array and said at least first local control field programmable gate array, comprises downloading from said host control computer.

16. The method of claim 13, wherein said simulating comprises:

collecting short snapshots at regular intervals to identify a period where a fault originates; and obtaining a more complete waveform trace in said identified period where said fault occurs, via a simulation replay at a finer granularity.

17. An apparatus comprising:

means for programming a plurality of target field programmable gate arrays to map portions of a target system;

means for initializing a plurality of local clock control state machines residing in said target field programmable gate arrays;

means for training serial communication links which interconnect said plurality of target field programmable gate arrays in accordance with a connection topology, such that said links are free-running and synchronized, and configured to guarantee transfer of a new sample of multiplexed target system signals between two communicating ones of said plurality of target field programmable gate arrays in one target system clock cycle;

means for loading test code for conducting a simulation of said target system into at least one external memory device accessible to said plurality of target field programmable gate arrays; and means for simulating said target system with said plurality of target field programmable gate arrays, in a cycle-reproducible manner, under control of said test code, wherein said plurality of target field programmable gate arrays each comprises a local clock generation unit and a device under test partition of said test system, said local clock generation unit generating a set of stoppable clocks supplied to said device under test partition and a set of free-running clocks, wherein said set of free-running clocks are synchronized to said set of stoppable clocks and each of said plurality of target field programmable gate arrays runs in lockstep according to said free-running clocks.

18. The apparatus of claim 17, further comprising:

means for programming a global control field programmable gate array and at least a first local control field programmable gate array, said global control field programmable gate array being coupled to a host control computer, said at least first local control field programmable gate array being coupled to said global control field programmable gate array and at least a first portion of said plurality of target field programmable gate arrays;

means for receiving, at said global control field programmable gate array, from said host control computer, a command to start said simulating step by running a predetermined number of clock cycles; and means for translating said command to start said simulating step to a "go" pulse that has a duration corresponding to said predetermined number of clock cycles, using said global control field programmable gate array.

19. The apparatus of claim 18, wherein:

said means for programming of said plurality of target field programmable gate arrays, and said means for programming of said global control field programmable gate array and said at least first local control field programmable gate array, comprise means for downloading from said host control computer.

20. The apparatus of claim 17, wherein said means for simulating comprise:

means for collecting short snapshots at regular intervals to identify a period where a fault originates; and means for obtaining a more complete waveform trace in said identified period where said fault occurs, via a simulation replay at a finer granularity.

* * * * *